(12) United States Patent
Kelkar et al.

(10) Patent No.: US 11,145,710 B1
(45) Date of Patent: Oct. 12, 2021

(54) ELECTRODE/DIELECTRIC BARRIER MATERIAL FORMATION AND STRUCTURES

(71) Applicant: Micron Technology, Inc., Boise, ID (US)

(72) Inventors: Sanket S. Kelkar, Boise, ID (US); Christopher W. Petz, Boise, ID (US); Dojun Kim, Boise, ID (US); Matthew N. Rocklein, Boise, ID (US); Brenda D. Kraus, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/913,549

(22) Filed: Jun. 26, 2020

(51) Int. Cl.
| | |
|---|---|
| *H01L 21/8242* | (2006.01) |
| *H01L 27/108* | (2006.01) |
| *H01L 49/02* | (2006.01) |
| *H01L 21/285* | (2006.01) |

(52) U.S. Cl.
CPC ........ *H01L 28/75* (2013.01); *H01L 21/28568* (2013.01); *H01L 27/1085* (2013.01); *H01L 27/10805* (2013.01)

(58) Field of Classification Search
CPC ......... H01L 28/57; H01L 28/75; H01L 29/92; H01L 29/94; H01L 21/76841

USPC ........ 257/303, 306, 310, 313; 438/253, 627, 438/643, 653
See application file for complete search history.

(56) References Cited

U.S. PATENT DOCUMENTS

| | | | |
|---|---|---|---|
| 6,624,069 B2 * | 9/2003 | Lee | H01L 28/84 438/665 |
| 6,921,702 B2 | 7/2005 | Ahn et al. | |
| 7,002,202 B2 * | 2/2006 | Yang | H01L 28/56 257/298 |
| 7,101,813 B2 | 9/2006 | Ahn et al. | |
| 7,655,519 B2 * | 2/2010 | Chung | H01L 21/7687 438/253 |
| 8,466,016 B2 | 6/2013 | Forbes et al. | |
| 8,652,957 B2 | 2/2014 | Ahn et al. | |
| 8,729,704 B2 * | 5/2014 | Min | H01L 28/75 257/751 |
| 8,772,050 B2 | 7/2014 | Ahn et al. | |
| 9,502,256 B2 | 11/2016 | Ahn et al. | |

\* cited by examiner

*Primary Examiner* — Calvin Lee
(74) *Attorney, Agent, or Firm* — Brooks, Cameron & Huebsch, PLLC

(57) ABSTRACT

Methods, apparatuses, and systems related to forming a barrier material between an electrode and a dielectric material are described. An example method includes forming a dielectric material on a bottom electrode material of a storage node in a semiconductor fabrication process. The method further includes forming a barrier material on the dielectric material to reduce oxygen vacancies in the dielectric material. The method further includes forming a top electrode on the barrier material.

14 Claims, 7 Drawing Sheets

ELECTRODE/DIELECTRIC BARRIER MATERIAL FORMATION AND STRUCTURES

TECHNICAL FIELD

The present disclosure relates generally to semiconductor devices and methods, and more particularly to forming a barrier material between an electrode and a dielectric to reduce oxygen vacancies in the dielectric material and to increase the breakdown voltage of the dielectric.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
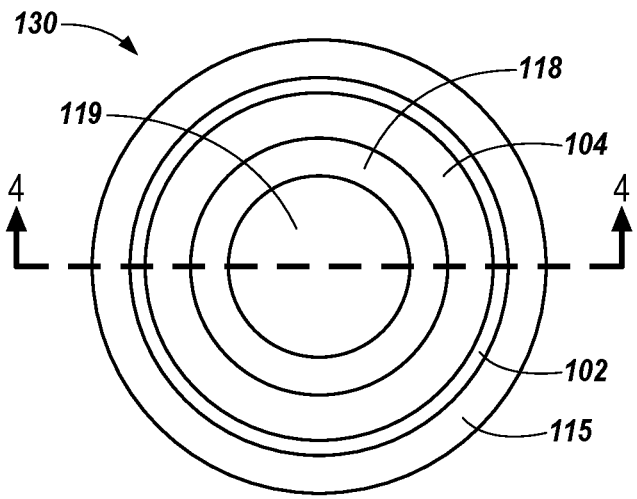
FIG. 1 illustrates an example top-down view of a storage node including a barrier material formed between a top electrode and a dielectric material of the storage node in accordance with a number of embodiments of the present disclosure.

Various types of memory devices, including arrays of volatile and/or non-volatile memory cells (e.g., a memory array), may include thin electrodes, e.g., electrode materials in a capacitor structure. Memory devices may also include thin layers of other materials that serve as components of a storage node, e.g., a top electrode of a capacitor structure, dielectric material, bottom electrode of the capacitor structure. A dielectric material may be formed between the two electrode materials, e.g., top and bottom electrode.

There are thermal or electrical stresses that may occur during a fabrication process, particularly after storage node, e.g., capacitor, formation in dynamic random access memory (DRAM) cell back end of the line (BEOL) fabrication processes. To reduce oxygen vacancies caused by the negative effects of the thermal stressors and/or to increase the breakdown voltage of a cell, at least one embodiment of the present disclosure includes forming a barrier material between electrodes and a dielectric layer of a storage node, e.g., capacitor. Forming a barrier material between electrodes and the dielectric layer of a capacitor is provided herein as an illustrative example. However, embodiments of the present disclosure are not so limited. For example, embodiments of the barrier material may be used in other devices such as a NAND high-k blocking oxides, or a high-k Complementary Metal Oxide Semiconductor (CMOS) structures, or any other high-k access device. Embodiments may also include forming a plurality of barrier materials in a bi-layer and/or gradient manner between conductive and dielectric layers.

Oxygen vacancies may be created in a cell dielectric layer due to thermal stresses induced during downstream processing or due to electrical stresses during the actual operation of the device. These defects may lead to worse dielectric leakage, lower dielectric breakdown voltage and lower device reliability. In order to mitigate this issue, methods for forming a barrier material between electrodes and the dielectric material, are described herein. As an example, a barrier material may be deposited on the dielectric material between the dielectric material and the top electrode and/or on the bottom electrode between the bottom electrode and the dielectric material. The barrier material may also be deposited on both sides of the dielectric material. For example, a first barrier material may be deposited on top of the bottom electrode, below the dielectric material, while a second barrier material may be deposited above the dielectric material, below the top electrode.

Fabrication of semiconductor structures, such as storage nodes of a memory device, may involve moving semiconductor wafers, upon which semiconductor structures are being formed, in and out of various processing apparatus. Different structures may be formed "in-situ", e.g., in place in a processing apparatus, and/or "ex-situ", e.g., between various processing apparatus, in a semiconductor fabrication process. Various processes may include using multiple semiconductor chambers to perform various semiconductor fabrication processes. Hence, a semiconductor wafer, and semiconductor structures formed thereon, may be transported between different semiconductor fabrication apparatuses during a semiconductor fabrication process.

As noted, as a semiconductor fabrication process is performed, a dielectric material may go through thermal stress from later back end of the line (BEOL) processes which may result in a neighboring electrode scavenging oxygen from the dielectric material. Such effects produce oxygen vacancies in the dielectric material. Oxygen vacancies may lead to a lower dielectric breakdown voltage and higher dielectric leakages. According to embodiments described herein, a barrier material may be used to prevent oxygen vacancy defects within the dielectric material. The barrier material structure and methods described herein may be formed "in-situ" or "ex-situ".

The present disclosure includes methods, apparatuses, and systems related to forming a barrier material between electrodes and a dielectric material, e.g., storage cell in a capacitor. An example of a method described herein includes forming a dielectric material on a bottom electrode material of a storage node in a semiconductor fabrication process. The method further includes forming a barrier material on the dielectric material between the dielectric material and a top electrode to reduce oxygen vacancies which may occur through oxygen scavenging by the top electrode in higher temperature BEOL processes, for example. The method further includes forming a top electrode on the barrier material.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something may refer to one or more such things. For example, a number of capacitors may refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

Again, it is noted that while the present disclosure discusses, for example illustration, a process in reference to a barrier layer between an electrode and a dielectric layer of a storage node in the form of a capacitor cell and in the context of a DRAM memory array. However, embodiments are not limited to this example structure, circuitry, or device formation in a semiconductor fabrication process. Embodiments may cover forming a barrier material on other semiconductor components, such as access lines (e.g., wordlines), sense lines (e.g., digit lines, bit lines, etc.), or otherwise conductive surfaces, and devices produced therefrom, as formed according to the techniques described herein. For example, embodiments of the barrier material are not limited to forming a barrier material on a dielectric material in connection with forming a DRAM memory array. Embodiments may be used in forming a barrier material on a high-k blocking oxide in connection with forming a NAND device or other devices. Similarly, embodiments may be used with forming the barrier material in a Complementary Metal Oxide Semiconductor (CMOS) high-k fabrication process.

FIG. 1 illustrates an example top-down view of a storage node including a barrier material formed between the dielectric layer and a top electrode of a storage node in accordance with a number of embodiments of the present disclosure. FIG. 1 illustrates storage node 130 as a capacitor 130, including the barrier material 102. However, embodiments of the present disclosure are not limited to capacitors as storage nodes.

FIG. 1 illustrates a single-sided pillar capacitor 130 in which a bottom electrode 118 may be formed in contact with a fill material 119. Non-limiting examples of the fill material 119 include polysilicon, silicon nitride, titanium nitride, tungsten, and doped versions thereof. Although not illustrated, embodiments, as described herein, may also be executed on other single-sided capacitor types, or a double-sided capacitor structure, etc.

The bottom electrode 118 may be formed on the fill material 119 to a thickness of a range between 15 to 65 angstroms (Å). However, embodiments are not limited to this example and the bottom electrode 118 may be formed from conductive materials and to various widths (e.g., thicknesses) as suited to a particular design rule for the formation of an operable capacitor for a semiconductor device. Non-limiting examples of the bottom electrode 118 may include a platinum (Pt) material, a ruthenium (Ru) material, a titanium nitride (TiN) material, a doped TiN material (such as titanium silicon nitride (TiSiN) or titanium boron nitride (TiBN)), a tungsten (W) material, a molybdenum (Mo) material, a tantalum nitride (TaN) material, an aluminum (Al) material, a rhodium (Rh) material, a tungsten nitride (WN) material, and a ruthenium oxide ($RuO_2$) material.

A dielectric material 104 may be formed in contact with the bottom electrode 118. A non-limiting example of the dielectric material 104 is a zirconium oxide material. The dielectric material 104 may be formed from a high dielectric constant (high-k) material. A high-k material may have a dielectric constant above 9. Other non-limiting examples of the dielectric material 104 may include aluminium oxide ($AlO_3$), zirconium oxide ($ZrO_2$), hafnium oxide ($HfO_2$), lanthanum oxide ($La_2O_3$), among others. The dielectric material 104 may be formed on the bottom electrode 118 to a thickness of a range between 10 to 70 angstroms (Å). Embodiments, however, are not limited to this example thickness range and the dielectric material 104 may be formed to various widths (e.g., thicknesses) as suited to a particular design rule and to achieve the goals described herein for the formation of an operable capacitor for a semiconductor device.

According to various embodiments, a barrier material 102 is formed in contact with the dielectric material 104 between the dielectric material 104 and an electrode, e.g., a top electrode 115. The barrier material 102 may be formed on the dielectric material 104 to a thickness of a range between 3 to 20 angstroms (Å). The barrier material 102 may or may not be formed from conductive materials and may be formed to various widths (e.g., thicknesses) as suited to a particular design rule and to achieve the goals described herein for the formation of an operable capacitor for a semiconductor device. The barrier material 102 may be formed by depositing a high oxygen content $TiO_xN_y$ film, using an atomic layer deposition (ALD) process. The deposition process may include flowing a titanium tetrachloride ($TiCl_4$) gas to a surface of the dielectric material 104 in a vacuum reaction chamber of a semiconductor fabrication processing tool followed by flowing purging inert gases. Subsequently, the deposition process may include flowing an ammonia ($NH_3$) gas into the vacuum reaction chamber of the semiconductor fabrication processing tool and then flowing purging inert gases. This sequence may be repeated for some number of iterations, e.g., cycles, for a resultant TiN deposition. According to embodiments, the deposition sequence just described is interspersed with a controlled flow of oxygen precursors as gas reactants into the vacuum reaction chamber of the semiconductor fabrication processing tool followed by flowing purging inert gases. This sequence may also be repeated for some number of iterations, e.g., cycles. Non-limiting examples of the oxygen reactants may include ozone ($O_3$), water ($H_2O$), nitrous oxide ($N_2O$), nitric oxide (NO), $H_2/O_2$ plasma, among other oxygen precursors.

The oxygen content of the $TiO_xN_y$ film may be tailored by adjusting the number of cycles conducted of the TiN deposition relative to the number of cycles conducted flowing the oxygen precursors during the ALD process. The relative number of cycles is referred to herein as the $TiN:O_2$ cycle ratio. By way of example only, the oxygen content in the $TiO_xN_y$ film may be tailored by adjusting the number of cycles of TiN deposition relative to the number of cycles of oxygen deposition. By increasing the number of cycles of the oxygen deposition relative to the number of cycles of the TiN deposition, the oxygen content in the TiN may be increased. Similarly, by decreasing the number of cycles of the oxygen deposition relative to the number of cycles of the TiN deposition, the oxygen content in the $TiO_xN_y$ film may be decreased. By way of example only, conducting a 10:1 $TiN:O_2$ cycle ratio produces a $TiO_xN_y$ film having a higher oxygen content than that achieved using a 40:1 $TiN:O_2$ cycle ratio. In some embodiments, by way of example and not by way of limitation, the oxygen content in the $TiO_xN_y$ film may be controlled, by a $TiN:O_2$ cycle ratio in a range of between 1 to 50. Embodiments, however, are not limited to this example.

Other examples of titanium precursors may also include, but are not limited to, tetrakis (ethylmethylamido) titanium (TEMAT), tetrakis (dimethylamido) titanium (TDMAT), titanocenes or combinations thereof. Other examples of nitrogen precursors may also include, but are not limited to, nitrogen ($N_2$), ammonium ($NH_4+$), or combinations thereof. Atomic layer deposition (ALD), single wafer tools, batch furnace tools, chemical vapor deposition (CVD), or any variant of ALD or deposition schemes, may be used in forming the barrier material 102.

As one continuing example, not to the exclusions of others, oxygen may be flowed in the above described semiconductor fabrication processes at a flowrate in a range of between 50 to 2000 standard cubic centimeters per minute (sccm) with an oxygen flow time in a range of between 0.2 to 600 seconds (s). The resultant barrier material 102, e.g., a resultant titanium oxynitride ($TiO_xN_y$) film, may have an oxygen content in the range of between 3 to 60 atomic % of the $TiO_xN_y$ film. In some example embodiments the $TiO_xN_y$ film may be deposited in a temperature range of between 350° Celsius (C) to 550° C. The resulting high oxygen content of the barrier material 102 may reduce oxygen scavenging from the dielectric material 104 by neighboring electrodes in later BEOL processing steps.

The resulting barrier material 102, existing as a $TiO_xN_y$ film, may be formed by having a titanium nitride (TiN) compound and a titanium oxide ($TiO_2$) compound existing together as an artificial layer. The resulting combination of these compounds may also be referred to herein as a $TiO_xN_y$ barrier layer 102.

As shown in FIG. 1, a top electrode 115 may be formed in contact with the barrier material 102. The top electrode 115 may be formed on the barrier material 102 to a thickness of a range between 10 to 40 angstroms (Å). The top electrode 115 may be formed from conductive materials and to various widths (e.g., thicknesses) as suited to a particular design rule for the formation of an operable capacitor for a semiconductor device. Non-limiting examples of the top electrode 115 may include a platinum (Pt) material, a ruthenium (Ru) material, a titanium nitride (TiN) material, a doped TiN material, a tungsten (W) material, a molybdenum (Mo) material, a tantalum nitride (TaN) material, an aluminum (Al) material, a rhodium (Rh) material, a tungsten nitride (WN) material, and a ruthenium oxide ($RuO_2$) material.

Fabrication of semiconductor structures may involve moving semiconductor wafers, upon which semiconductor structures are being formed, into and out of fabrication apparatus as part of a particular fabrication process. Certain fabrication processes may be performed together, "in-situ", within a particular fabrication apparatus and controlled environment setting, e.g., within a vacuum environment of a particular tool, and other fabrication processes may be performed separately, "ex-situ", after a wafer has been moved in the fabrication process, or the control environment settings of a particular tool have changed, according to various semiconductor fabrication techniques. Hence, the semiconductor structure may be transported between different semiconductor fabrication apparatuses during a semiconductor fabrication process. This may include using multiple semiconductor chambers to perform various semiconductor fabrication processes. Accordingly, various process steps associated with the barrier material 102 formation process described herein may be performed either "in-situ" or "ex-situ".

In some embodiments, the barrier material 102 may be formed in a layer "within" the top electrode material 115. Hence, the resultant structure may have a first layer of a top electrode material 115 below a barrier material 102, e.g., the $TiO_xN_y$ film, between the barrier material 102 and the dielectric layer 104. A second layer of the top electrode material 115 may then exist above the barrier material 102. In this example, the structure shown in FIG. 1 would instead include: a fill material 119, a bottom electrode 118, a dielectric material 104, a first layer of the top electrode material 115, then next a barrier material 102, and then a second layer of the top electrode material 115 formed upon the barrier material 102.

Figure 2:
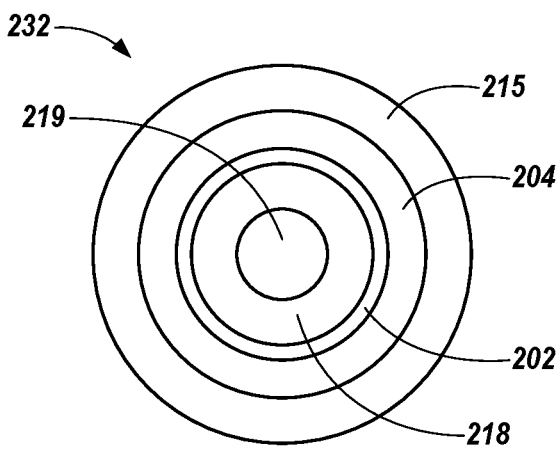
FIG. 2 illustrates another barrier material placement in an example top-down view of a storage node including a barrier material formed between a bottom electrode and a dielectric material of the storage node in accordance with a number of embodiments of the present disclosure.

FIG. 2 illustrates another barrier material 202 placement in an example top-down view of a storage node. The example embodiment of FIG. 2 illustrates the barrier material 202 formed between a bottom electrode 218 and the dielectric layer 204. While FIG. 2 illustrates a single-sided pillar capacitor 232 structure, embodiments are not so limited. Again, for example, the barrier material 102 placement may be executed on a double-sided capacitor. For ease of illustration, the top-down view 232 may include the same or similar elements as the example top-down view 130 as referenced in FIG. 1. For example, the fill material 219 may be analogous or similar to fill material 119 described in connection with FIG. 1. Bottom electrode 218 may be analogous or similar to the bottom electrode 118 described in connection with FIG. 1. The barrier material 202 may be analogous or similar to barrier material 102 described in detail in connection with FIG. 1. And further, the dielectric material 204 and top electrode 215 may be analogous or similar to the dielectric material 104 and the top electrode 115 described in connection with FIG. 1.

In this embodiment, the timing and fabrication process may be changed to form the barrier material 202 between the bottom electrode 218 and the dielectric material 204. The bottom electrode may be formed in contact with a fill material 219 and the barrier material 202 is formed, as described herein, is formed in contact with the bottom electrode 218, between the bottom electrode 218 and a dielectric material 204. In this example, the dielectric material 204 is thus formed in direct contact to the top electrode 215.

Figure 3:
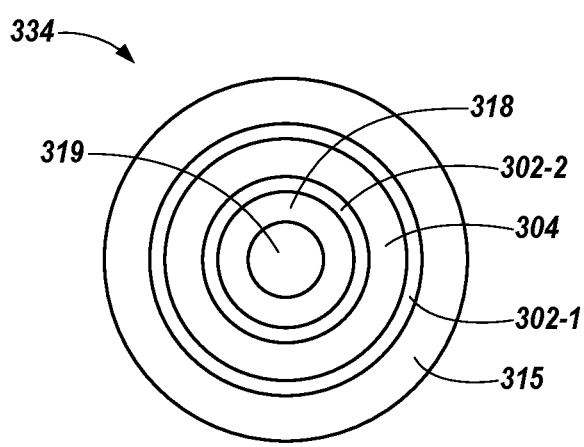
FIG. 3 illustrates another barrier material placement in an example top-down view of a storage node including a barrier material formed between both a top electrode and a bottom electrode and a dielectric material of the storage node in accordance with a number of embodiments of the present disclosure.

FIG. 3 illustrates another barrier material, 302-1 and 302-2, placement in an example top-down view of a storage node. The example of FIG. 3 illustrates the barrier material 302-1 being formed between the top electrode 315 and the dielectric material 304 as well as the barrier material 302-2 being formed between the bottom electrode 318 and the dielectric material 304. In some embodiments the barrier materials 302-1 and 302-2 may be the same thickness, and/or composition, and/or be formed according to a same process technique among those described herein. Or, alternatively, the barrier materials 302-1 and 302-2 may be of different thicknesses, and/or composition, and/or be formed according to different process techniques among those described herein. Again, while FIG. 3 illustrates a single-sided pillar capacitor 334, embodiments are not so limited. For example, embodiments, described herein, may be implemented on a double-sided capacitor, or other geometry.

In the example embodiment of FIG. 3, the top down 334 may include the same or similar elements as the example top-down views 130 and 232 as referenced in FIGS. 1 and 2, respectively. For example, the fill material 319 may be analogous or similar to fill material 119 and 219 of FIGS. 1 and 2, respectively. The bottom electrode 318 may be analogous or similar to bottom electrode 118 and 218 of FIGS. 1 and 2, respectively. The dielectric material 304 may be analogous or similar to dielectric material 104 and 204 of FIGS. 1 and 2, respectively. And, the top electrode 315 may be analogous or similar to top electrode 115 and 215 of FIGS. 1 and 2, respectively.

In this embodiment, a bottom electrode 318 may be formed in contact with a fill material 319 and an "inner" barrier material 302-2. The inner barrier material 302-2 may be formed between, and in contact with, the bottom electrode 318 and a dielectric material 304. The dielectric material 304 may be formed in contact with "both" the inner barrier material 302-2 and an outer barrier material 302-1. The outer barrier material 302-1 may be formed between, and in contact with, the dielectric material 304 and a top electrode 315. Thus, the top electrode 315 is also formed in contact with a barrier material, e.g., the outer barrier material 302-1.

In some embodiments, by way of example and not by way of limitation, the inner barrier material 302-2 may be formed to a thickness in a range of between 3 to 20 angstroms (Å). Similarly, the outer barrier material 302-1 may be formed to a thickness in a range of between 3 to 20 angstroms (Å). Embodiments, however, are not limited to these examples. The barrier material (collectively referred to as 302) may be formed to various widths (e.g., thicknesses) as suited to a particular design rule for the formation of an operable capacitor for a semiconductor device.

FIGS. 1-3 provide examples of the capacitor structures 130, 232, and 334 having circular cross-sections. However, embodiments of the present disclosure are not so limited. Capacitors 130, 232, and 334 could have square, rectangular, or other polygonal cross-sections and geometries. The capacitors 130, 232, and 334 may serve as a storage node of a memory cell, e.g., a DRAM cell. For example, a memory device may include an array of DRAM memory cells including capacitors 130, 232, and/or 334 having barrier materials 102, 202, and 302 formed according to embodiments described herein.

Figure 4A:
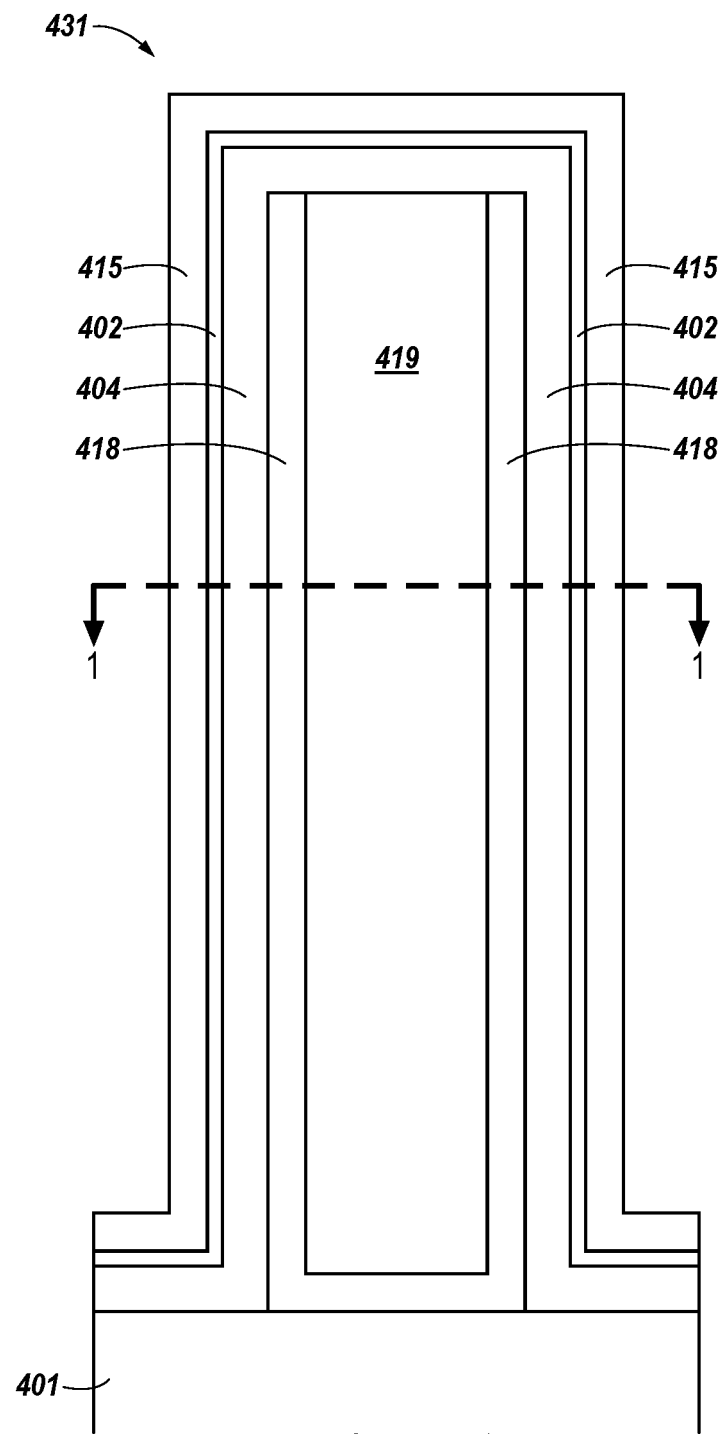
FIG. 4A illustrates an example cross-sectional side view of the storage node illustrated in FIG. 1 taken along cut line 4-4.

FIG. 4A illustrates an example cross-sectional side view of the storage node 130 illustrated in FIG. 1 taken along cut line 2-2. Conversely, FIG. 1 illustrates a cross-sectional view of the capacitor 431 along the cut line 1-1 illustrated in FIG. 4A. The component arrangement of capacitor 431 is thus analogous to that of capacitor 130 illustrated in FIG. 1. The numbered elements in FIG. 4A are analogous to the numbered elements shown in FIG. 1. For example, the fill material 419 is analogous or similar to fill material 119 of FIG. 1. The bottom electrode 418 is analogous or similar to bottom electrode 118 of FIG. 1. The dielectric material 404 is analogous or similar to second nitride material 104 of FIG. 1. The barrier material 402 is analogous or similar to barrier material 102 of FIG. 1. And, the top electrode 415 is analogous or similar to top electrode 115 of FIG. 1.

However, it is noted that in the cross-sectional view 431 of FIG. 4A, the numbered elements could have an alternative arrangement analogous to the various barrier material placement alternative shown among the example cross-sectional, top-down views 130, 232, and 334 referenced in FIGS. 1, 2, and 3, respectively.

As illustrated in FIG. 4A, the capacitor 431 may include the bottom electrode 418 which may be formed in contact with a fill material 419. For example, the fill material 419 may be formed within a cavity formed by the bottom electrode 418. The bottom electrode 418 may be formed in contact with the fill material 419 and in contact with a dielectric material 404. For ease of illustration only, the bottom electrode 418 is further illustrated on a working surface of a semiconductor material 401, which according to one semiconductor fabrication process may be processed to become a conductive contact from an access device to the bottom electrode 418 of capacitor 431. The dielectric material 404 may be formed in contact with the bottom electrode 418 and a barrier material 402. The barrier material 402 may be formed between, and in contact, with the dielectric material 404 and a top electrode material 415.

As noted above, forming the barrier material 402 between the top electrode 415 and the dielectric material 404 may reduce oxygen scavenging from the dielectric material 404 by the top electrode 415 during subsequent processing steps and reduce oxygen vacancies within the dielectric material 404. The reduction of oxygen vacancies may improve the dielectric breakdown voltage and reduce the dielectric material 404 leakage. The barrier material 402 may increase an effective work function in a range of between 0.0 to 0.5 eV.

Figure 4B:
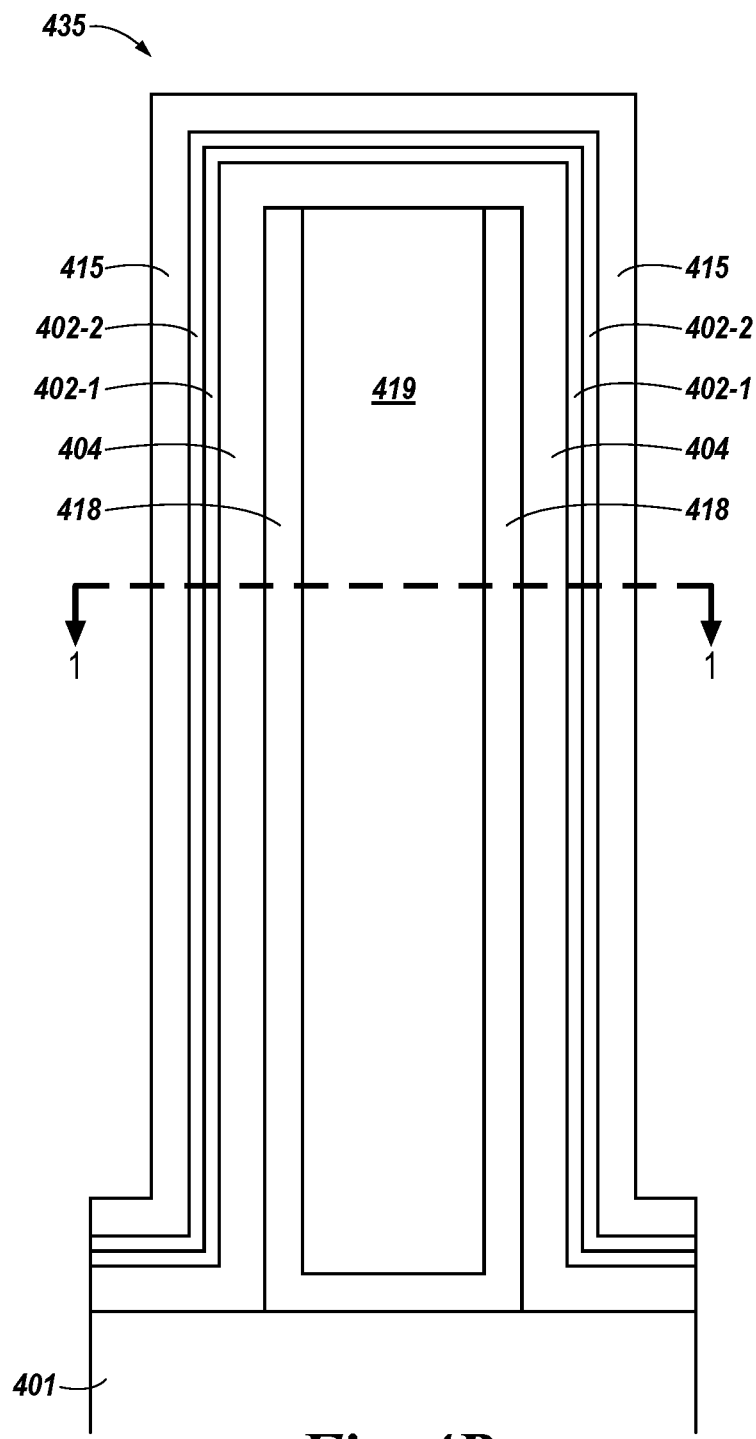
FIG. 4B illustrates an example cross-sectional side view of a storage node including a barrier material formed as a "bi-layer" structure between a top electrode and a dielectric material of the storage node in accordance with a number of embodiments of the present disclosure.

FIG. 4B illustrates another barrier material formation and placement embodiment in an example cross-sectional side view of a storage node. The example cross-sectional, side view of FIG. 4B illustrates a "bi-layer" embodiment of the barrier material having layers 402-1 and 402-2 formed between a top electrode 415 and a dielectric layer 404 of a storage node, e.g., capacitor 435. The capacitor 435 and components thereof may be analogous to capacitors 130, 232, 334, and 431 and components thereof illustrated in FIGS. 1, 2, 3, and 4A. Hence, the cross-sectional view 435 may include the same or similar elements as the example top-down views 130, 232, 334, and cross-sectional view 431 as referenced in FIGS. 1, 2, 3, and 4A respectively. For example, the fill material 419 may be analogous or similar to fill material 119, 219, and 319 of FIGS. 1, 2, and 3, respectively. The bottom electrode 418 may be analogous or similar to bottom electrode 118, 218, and 318 of FIGS. 1, 2, and 3, respectively. The dielectric material 404 may be analogous or similar to dielectric material 104, 204, and 304 of FIGS. 1, 2, and 3, respectively. The top electrode 415 may be analogous or similar to top electrode 115, 215, and 315 of FIGS. 1, 2, and 3, respectively. However, the particular difference illustrated in FIG. 4B is that the barrier material has a "bi-layer" composition having distinct layers 402-1 and 402-2. Again, for ease of illustration only, the bottom electrode 418 is illustrated on a working surface of a semiconductor material 401 which according to one semiconductor fabrication process may be processed to become a conductive contact to the bottom electrode 418.

In some embodiments, as illustrated in FIGS. 1, 2, 3, and 4A the barrier material may be substantially one, homogenous layer with a substantially fixed, continuous, or relatively evenly distributed oxygen content throughout the barrier material. Alternatively, the barrier material shown in FIGS. 1, 2, 3, and 4A may have a gradient in oxygen content in the $TiO_xN_y$ film, gradually decreasing or increasing in oxygen content throughout the barrier material along one direction or another. As noted above, the oxygen content of the $TiO_xN_y$ film may be tailored by adjusting the number of cycles conducted of the TiN deposition relative to the number of cycles conducted flowing the oxygen precursors during the ALD process. Thus, by increasing the number of cycles of the oxygen deposition relative to the number of cycles of the TiN deposition, the oxygen content in the $TiO_xN_y$ film may be increased. Similarly, by decreasing the number of cycles of the oxygen deposition relative to the number of cycles of the TiN deposition, the oxygen content in the $TiO_xN_y$ film may be decreased. Accordingly, the barrier material formation may be controlled to have a gradient composition in oxygen content throughout the barrier material.

However, as shown in FIG. 4B, in some example embodiments the barrier material may comprise of two (2), or more, distinct layers, e.g., 402-1 and 402-2. In some example embodiments, a "first" layer of the barrier material 402-1, e.g., a "bottom" layer, shown in the example of FIG. 4B may be formed in contact with the dielectric material 404. For example, the first layer 402-1 may be formed according to processing techniques described herein to "purposefully" achieve a higher oxygen content, e.g., higher oxygen content in a first layer of $TiO_xN_y$ film, in a layer closest to the dielectric material 404. As noted above, the oxygen content of the $TiO_xN_y$ film may be tailored by adjusting the number of cycles conducted of the TiN deposition relative to the number of cycles conducted of the oxygen deposition during the ALD process. Hence, the bi-layer 402-1 and 402-2 barrier material may be formed to have one or more, e.g., multiple, distinct portions. A "second" layer of the barrier material 402-2, e.g., a "top" layer, shown in the example of FIG. 4B may be formed in contact with the top electrode material 415. In this example, the second layer 402-2 may be formed according to processing techniques described herein to purposefully achieve a lower oxygen content, e.g., lower oxygen content in a second layer of $TiO_xN_y$ film, than that of the first layer of the barrier material 402-1, or than that of a preceding barrier material layer in a multi-layer barrier material composition having more that two (2) distinct layers.

Again, FIGS. 1-4B are example embodiments of geometries of capacitors with barrier materials formed according to the techniques described herein between dielectric layer, e.g., 104 in FIG. 1, and electrodes, e.g., top electrode 115 in FIG. 1. The example illustrations show the capacitors 130, 232, 334, 431, and 435 having a bottom electrode surrounding the fill material and separated from the top electrode by a dielectric material. However, embodiments of the present disclosure are not so limited. Other embodiment configurations may equally benefit from a barrier material separating a dielectric from an electrode. For example, alternate capacitors geometries may include "inside-out" designs such that the fill material may be surrounded by the top electrode which may surrounded by the barrier material which may be surrounded by a dielectric material which may be surrounded by the bottom electrode. Embodiments are not so limited to these examples.

Figure 5:
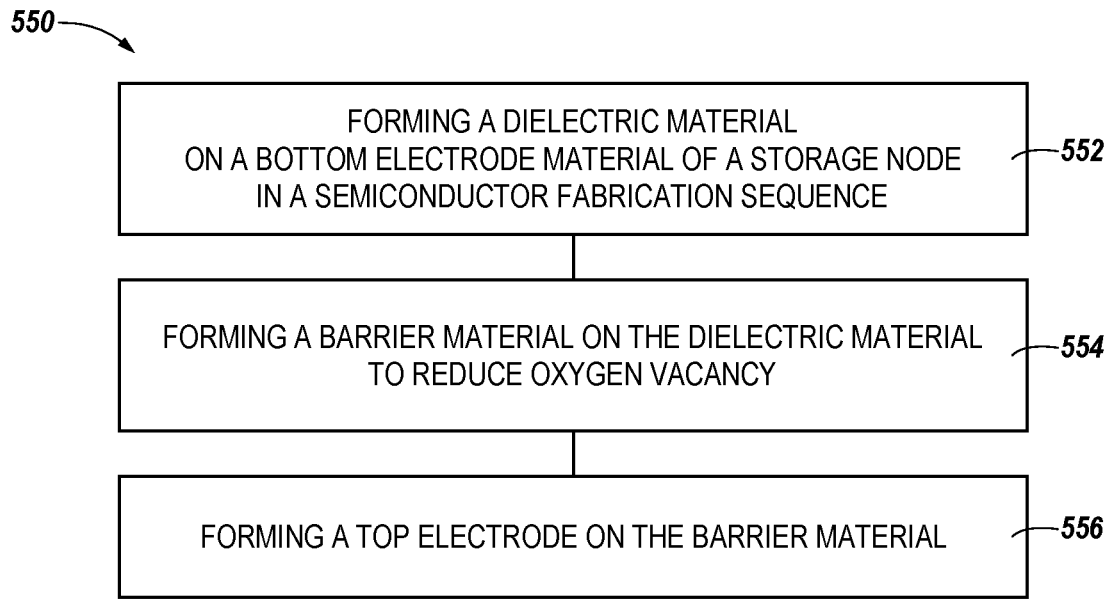
FIG. 5 is a flow diagram of an example method for forming a barrier material between a top electrode and a dielectric material of a storage node in a semiconductor fabrication process in accordance with a number of embodiments of the present disclosure.

FIG. 5 is a flow diagram of an example method 550 for forming a barrier material between an electrode and a dielectric material. In the example of FIG. 5, a barrier material is formed between a dielectric and a top electrode of a storage node in a semiconductor fabrication process. At block 552, the method 550 may include forming a dielectric material on a bottom electrode material of a storage node in a semiconductor fabrication process. In this embodiment, a storage node may be a capacitor.

The bottom electrode may be formed to a thickness of a range between 15 to 65 angstroms (Å). Non-limiting examples of the bottom electrode may include a platinum (Pt) material, a ruthenium (Ru) material, a titanium nitride (TiN) material, a doped TiN material, a tungsten (W) material, a molybdenum (Mo) material, a tantalum nitride (TaN) material, an aluminum (Al) material, a rhodium (Rh) material, a tungsten nitride (WN) material, and a ruthenium oxide ($RuO_2$) material. A fill material may be deposited within the geometry of the bottom electrode.

A dielectric material may be formed over and in contact with the bottom electrode. A non-limiting example of the dielectric material is a zirconium oxide material. The dielectric material may be formed from a high dielectric constant (high-k) material. A high-k material may have a dielectric constant above 9. Other non-limiting examples of the bottom electrode may include aluminium oxide ($Al_2O_3$), zirconium oxide ($ZrO_2$), hafnium oxide ($HfO_2$), lanthanum oxide ($La_2O_3$), among others. The dielectric material may be formed on the bottom electrode to a thickness of a range between 10 to 70 angstroms (Å). Embodiments are not limited to these example materials or thickness for the dielectric material.

At block 554, the method 550 may include forming a barrier material on the dielectric material to reduce oxygen vacancy formation in the dielectric layer. Oxygen vacancies may be created in the dielectric material, e.g., cell, due to thermal stresses induced during downstream processing or due to electrical stresses during the actual operation of the device. These defects may lead to worse dielectric material leakage. In prior approaches, titanium nitride (TiN) top electrodes may have been deposited on the dielectric, but the TiN top electrodes alone did not mitigate the effects of these stresses. According to embodiments described herein, however, a high oxygen content barrier material, e.g., a $TiO_xN_y$ film, may be formed between the dielectric and an adjacent electrode to mitigate the formation of oxygen vacancies, improve dielectric breakdown voltage, and better reduce dielectric leakage.

The barrier material is formed in contact with the dielectric material and between the dielectric material and a top electrode. The barrier material may be formed on the dielectric material to a thickness of a range between 3 to 20 angstroms (Å). Embodiments, however, are not limited to this example thickness range. According some embodiments, the barrier material may be formed by depositing a high oxygen content $TiO_xN_y$ film according to an ALD process as described herein.

As one example, the deposition process may include flowing a titanium tetrachloride ($TiCl_4$) gas to a surface of the dielectric material 104 in a vacuum reaction chamber of a semiconductor fabrication processing tool followed by a purge of the unreacted inert gases. Subsequently, the deposition process may include flowing an ammonia ($NH_3$) gas into the vacuum reaction chamber of the semiconductor fabrication processing tool and flowing purging inert gases to produce a resultant TiN deposition. This sequence may be repeated for some number of iterations, e.g., cycles. According to embodiments, the deposition sequence just described is interspersed with a controlled flow of oxygen gas reactants into the vacuum reaction chamber of the semiconductor fabrication processing tool followed flowing purging inert gases for some number of cycles to form a high oxygen content $TiO_xN_y$ film (barrier material 102) on a surface of the dielectric material 104. Non-limiting examples of the oxygen reactants may include ozone ($O_3$), water ($H_2O$), nitrous oxide ($N_2O$), nitric oxide (NO), $H_2/O_2$ plasma, among other oxygen precursors. Iterations of the above described titanium tetrachloride ($TiCl_4$) and ammonia ($NH_3$) gas sequence followed by oxygen reactant flow may be repeated through some number of alternating iterations, e.g., cycles. The oxygen content of the $TiO_xN_y$ film may be tailored by adjusting the number of cycles conducted of the TiN deposition relative to the number of cycles conducted flowing the oxygen precursors during the ALD process. The $TiO_xN_y$ film (barrier material 102) thickness on a surface of the dielectric material 104 can be controlled by the total number of alternating iterations of the above cycles. The relative number of cycles is referred to herein as the $TiN:O_2$ cycle ratio. In some embodiments, by way of example and not by way of limitation, the $TiN:O_2$ cycle ratio is in a range of between one (1) to fifty (50). The oxygen flow time is in a range of between of 0.2 to 600 seconds and the oxygen flow rate is in a range of between 50 to 2000 standard cubic centimeters per minute (sccm). Embodiments, however, are not limited to these example ranges. Other examples of titanium precursors may also include, but are not limited to, tetrakis (ethylmethylamido) titanium (TEMAT), tetrakis (dimethylamido) titanium (TDMAT), titanocenes or combinations thereof. Other examples of nitrogen precursors may also include, but are not limited to, Nitrogen ($N_2$), Ammonium ($NH_4+$), or combinations thereof. Atomic layer deposition (ALD), single wafer tools, batch furnace tools, chemical vapor deposition (CVD), or any variant of ALD or deposition schemes, may be used in forming the barrier material 102.

The resultant barrier material, e.g., a resultant titanium oxynitride ($TiO_xN_y$) film, may have an oxygen content in the range of between 3 to 60 atomic % of the $TiO_xN_y$ film. The titanium oxynitride ($TiO_xN_y$) film may be deposited at a temperature range of between 350° Celsius (C) to 550° C. The high oxygen content of the barrier material may reduce oxygen scavenging from the dielectric material. Hence, the $TiO_xN_y$ may be formed by having a titanium nitride (TiN) compound and a titanium oxide ($TiO_2$) compound existing together as an artificial layer. The combination of these compounds may be referred to as $TiO_xN_y$ and as such form the barrier material described herein.

Fabrication of semiconductor structures may involve moving semiconductor wafers, upon which semiconductor structures are being formed, in, i.e., "in-situ", and out of, "ex-situ", a vacuum environment according to a particular semiconductor fabrication process. That is, the semiconductor structure may be transported between different semiconductor fabrication apparatuses during a semiconductor fabrication process. This may include using multiple semiconductor chambers to perform various semiconductor fabrication processes. The barrier material may be deposited "in-situ" or "ex-situ" to other process steps in the storage node formation.

At block 556, the method 550 may include forming a top electrode on the barrier material. The top electrode may be formed in direct contact with the barrier material. The top electrode may be formed on the barrier material to a thickness of a range between 10 to 40 angstroms (Å). Non-limiting examples of the top electrode may include a platinum (Pt) material, a ruthenium (Ru) material, a titanium nitride (TiN) material, a doped TiN material, a tungsten (W) material, a molybdenum (Mo) material, a tantalum nitride (TaN) material, an aluminum (Al) material, a rhodium (Rh) material, a tungsten nitride (WN) material, and a ruthenium oxide ($RuO_2$) material.

Figure 6:
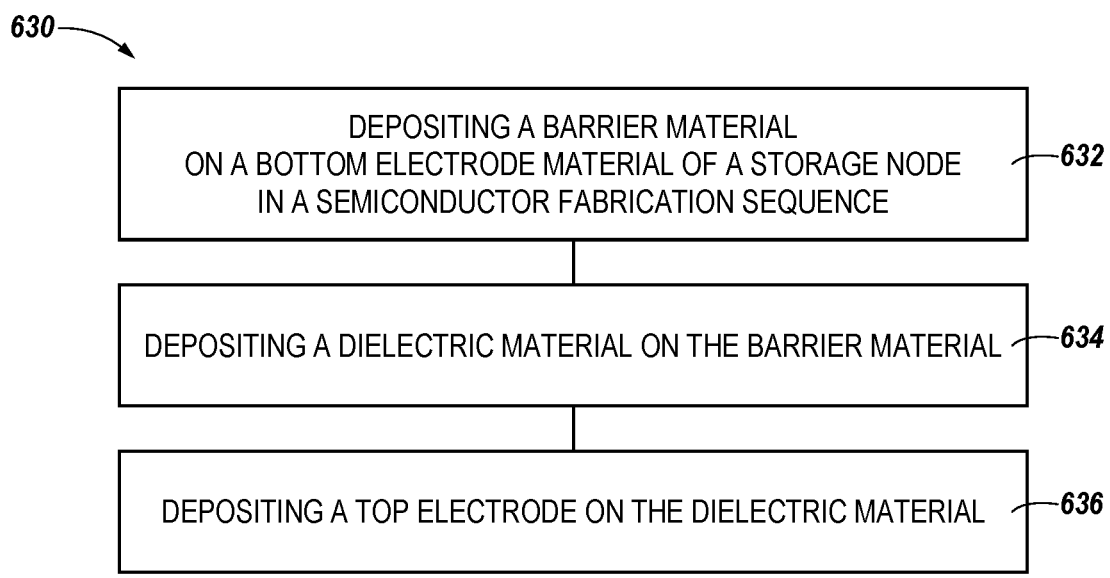
FIG. 6 is a flow diagram of an example method for depositing a barrier material between a bottom electrode and a dielectric material of a storage node in a semiconductor fabrication process in accordance with a number of embodiments of the present disclosure.

FIG. 6 is another flow diagram of an example method 630 for depositing a barrier material. In the example of FIG. 6, the barrier material is formed between a bottom electrode and a dielectric material of a storage node in a semiconductor fabrication process. The barrier material may be formed on the bottom electrode according to the methods described herein. At block 632, the method 630 may include depositing a barrier material on a bottom electrode material of a storage node in a semiconductor fabrication process. In some embodiments, a storage node may be a capacitor and the bottom electrode may be deposited on the fill material to a thickness of a range between 15 to 65 angstroms (Å).

At block 634, the method 630 may include depositing a dielectric material on the barrier material. The barrier material may have a thickness in a range of between 3 to 20 angstroms (Å). The barrier material may be formed by depositing high oxygen content titanium oxynitride ($TiO_xN_y$) film using an atomic layer deposition (ALD) as described herein.

A dielectric material may be formed separated from the bottom electrode by the barrier material. The dielectric material may be formed from a high dielectric constant (high-k) material. A high-k material may have a dielectric constant above 9. Non-limiting examples of the bottom electrode may include aluminium oxide ($AlO_3$), zirconium oxide ($ZrO_2$), hafnium oxide ($HfO_2$), lanthanum oxide ($La_2O_3$), among others. The dielectric material may be deposited on the bottom electrode to a thickness of a range between 10 to 70 angstroms (Å).

At block 636, the method 630 may include depositing a top electrode on the dielectric material. The top electrode may be deposited on the barrier material to a thickness of a range between 10 to 40 angstroms (Å). Non-limiting examples of the top electrode may include a platinum (Pt) material, a ruthenium (Ru) material, a titanium nitride (TiN) material, a doped TiN material, a tungsten (W) material, a molybdenum (Mo) material, a tantalum nitride (TaN) material, an aluminum (Al) material, a rhodium (Rh) material, a tungsten nitride (WN) material, and a ruthenium oxide ($RuO_2$) material.

Figure 7:
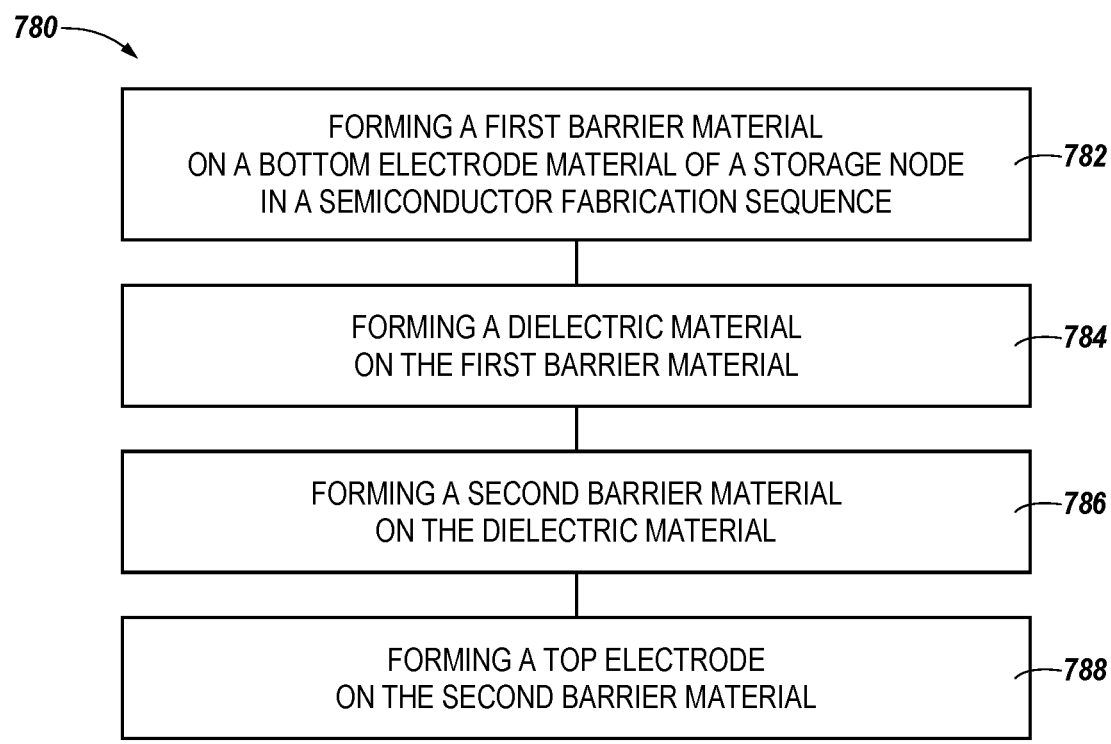
FIG. 7 is a flow diagram of an example method for forming a barrier material between both a bottom electrode and a dielectric material and a top electrode and the dielectric material in accordance with a number of embodiments of the present disclosure.

FIG. 7 is another flow diagram of an example method 780 for forming a barrier material between electrodes and a dielectric material of a storage node in a semiconductor fabrication process. In this example embodiment, a barrier material separates both a bottom electrode and a top electrode from the dielectric material. In this embodiment, a storage node may be a capacitor.

In a semiconductor fabrication process a bottom electrode may be constructed according to various semiconductor fabrication techniques. At block 782, the method 780 may include forming a first barrier material on the bottom electrode material. The barrier material may be formed according to the techniques described above and herein. In some embodiments, the first barrier material may be formed between the bottom electrode and the dielectric material to a thickness of a range between 3 to 20 angstroms (Å).

At block 784, the method 780 may include forming a dielectric material on the first barrier material. The dielectric material may be formed from a high dielectric constant (high-k) material. Non-limiting examples of the bottom electrode may include aluminium oxide ($AlO_3$), zirconium oxide ($ZrO_2$), hafnium oxide ($HfO_2$), lanthanum oxide ($La_2O_3$), among others. The dielectric material may be deposited on the barrier material to a thickness of a range between 10 to 70 angstroms (Å).

At block 786, the method 780 may include forming a second barrier material on the dielectric material. Again, the barrier material may be formed according to the techniques described above and herein. In this embodiment, the second barrier material may be formed between the dielectric material and a top electrode to a thickness in a range of between 3 to 20 angstroms (Å). The second barrier material may be formed by depositing a high oxygen content $TiO_xN_y$ film using an atomic layer deposition (ALD).

At block 788, the method 780 may include forming a top electrode on the second barrier material. The top electrode may be formed on the second barrier material to a thickness in a range of between 10 to 40 angstroms (Å). Non-limiting examples of the top electrode may include a platinum (Pt) material, a ruthenium (Ru) material, a titanium nitride (TiN) material, a doped TiN material, a tungsten (W) material, a molybdenum (Mo) material, a tantalum nitride (TaN) material, an aluminum (Al) material, a rhodium (Rh) material, a tungsten nitride (WN) material, and a ruthenium oxide ($RuO_2$) material.

Forming the first barrier material and the second barrier material between the dielectric and both the top electrode and the bottom electrode may reduce the oxygen scavenging from the dielectric material by the electrodes, thus reducing oxygen vacancies within the dielectric material. The reduction of oxygen vacancies may increase the dielectric breakdown voltage and reduce the dielectric material leakage. The barrier material may also increase the effective work function in a range of between 0.0 to 0.5 eV.

Figure 8:
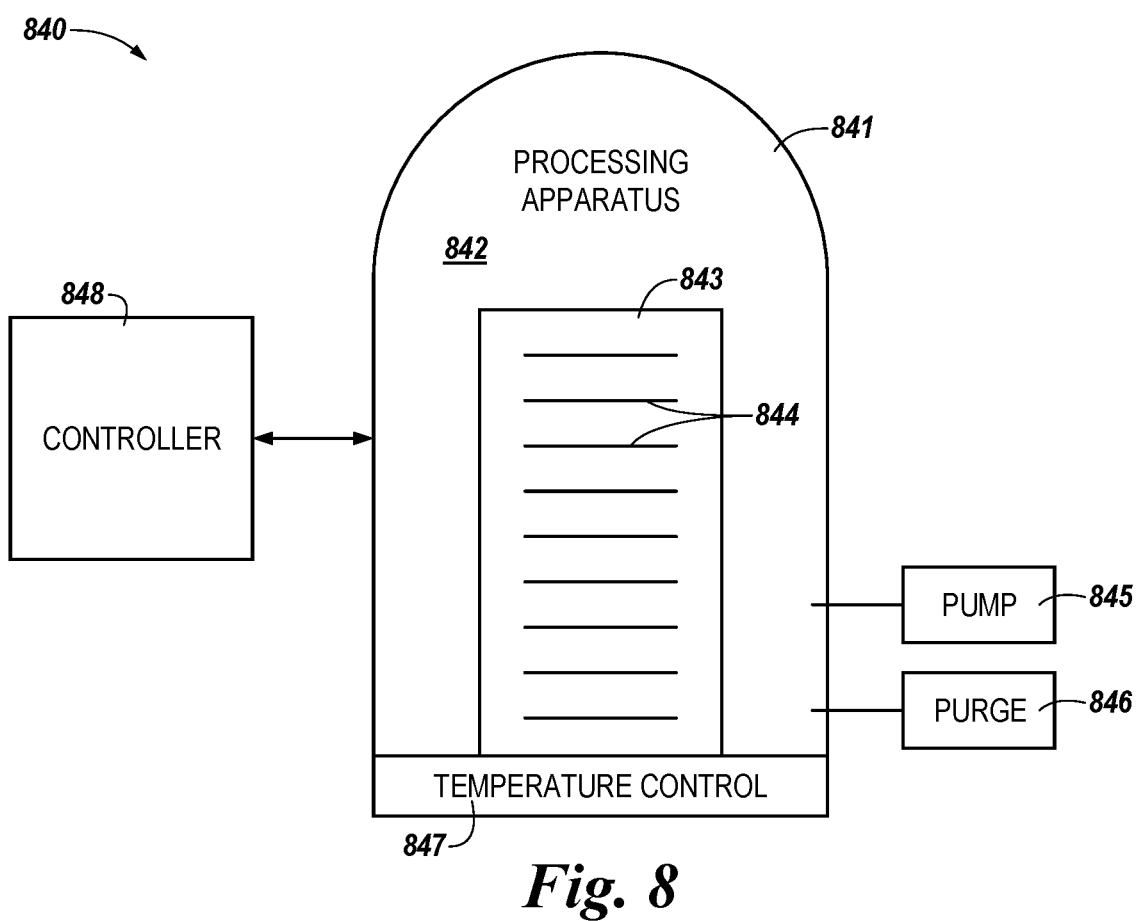
FIG. 8 is a representation of a processing apparatus which may be used, at least in part, for implementation of an example semiconductor fabrication process in accordance with a number of embodiments of the present disclosure.

FIG. 8 is a functional block diagram of an apparatus 840 for implementation of an example semiconductor fabrication process in accordance with a number of embodiments of the present disclosure. The system 840 may include a processing apparatus 841 (e.g., a semiconductor fabrication apparatus). The processing apparatus 841 may be configured to enable in-situ formation of a barrier material formed between electrodes.

The processing apparatus 841 may include a semiconductor processing chamber 842 to enclose components configured to form, in-situ in a semiconductor processing chamber 842, a barrier material (e.g., the barrier material 102, 202, 302-1, 302-2, and 402 described in association with FIGS. 1-4B) between a top electrode (e.g., the top electrode 115, 215, 315, and 415 described in association with FIGS. 1-4B) and a bottom electrode (e.g., the bottom electrode 118, 218, 318, and 418 described in association with FIGS. 1-4B). The semiconductor processing chamber 842 may further enclose a carrier 843 to hold a single and/or batch semiconductor wafers 844 forming semiconductor structures such as a top electrode, dielectric material, bottom electrode, and barrier material between one of both of the electrodes and the dielectric material. The processing apparatus 841 may include and/or be associated with tools including, for example, a pump unit 845 and a purge unit 846 configured to introduce and remove precursors as part of an atomic layer deposition (ALD) process, or other semiconductor fabrication process, as described herein to form a barrier material formed between a dielectric material and electrodes. In at least one embodiment, the processing apparatus 841 may include and/or be associated with tools including, for example, a pump unit 845 and a purge unit 846 configured to introduce and remove precursors as described herein to form barrier material formed between electrodes. The processing apparatus 841 may further include a temperature control unit 847 configured to maintain the semiconductor processing chamber 842 at an appropriate temperature as described herein (e.g., between approximately 350° C. and approximately 550° C.).

The system 840 may further include a controller 848. The controller 848 may include, or be associated with, circuitry and/or programming for implementation of, for instance, in-situ formation of a barrier material formed between electrodes. Adjustment of such deposition and purging operations by the controller 848 may control the thickness of the barrier material and/or position of the barrier material formed between electrodes as described herein.

The controller 848 can, in a number of embodiments, be configured to use hardware as control circuitry. Such control circuitry can, for example, be an application specific integrated circuit (ASIC) with logic to control fabrication steps, via associated deposition and purge processes, for in-situ formation of a barrier material formed between electrodes.

Figure 9:
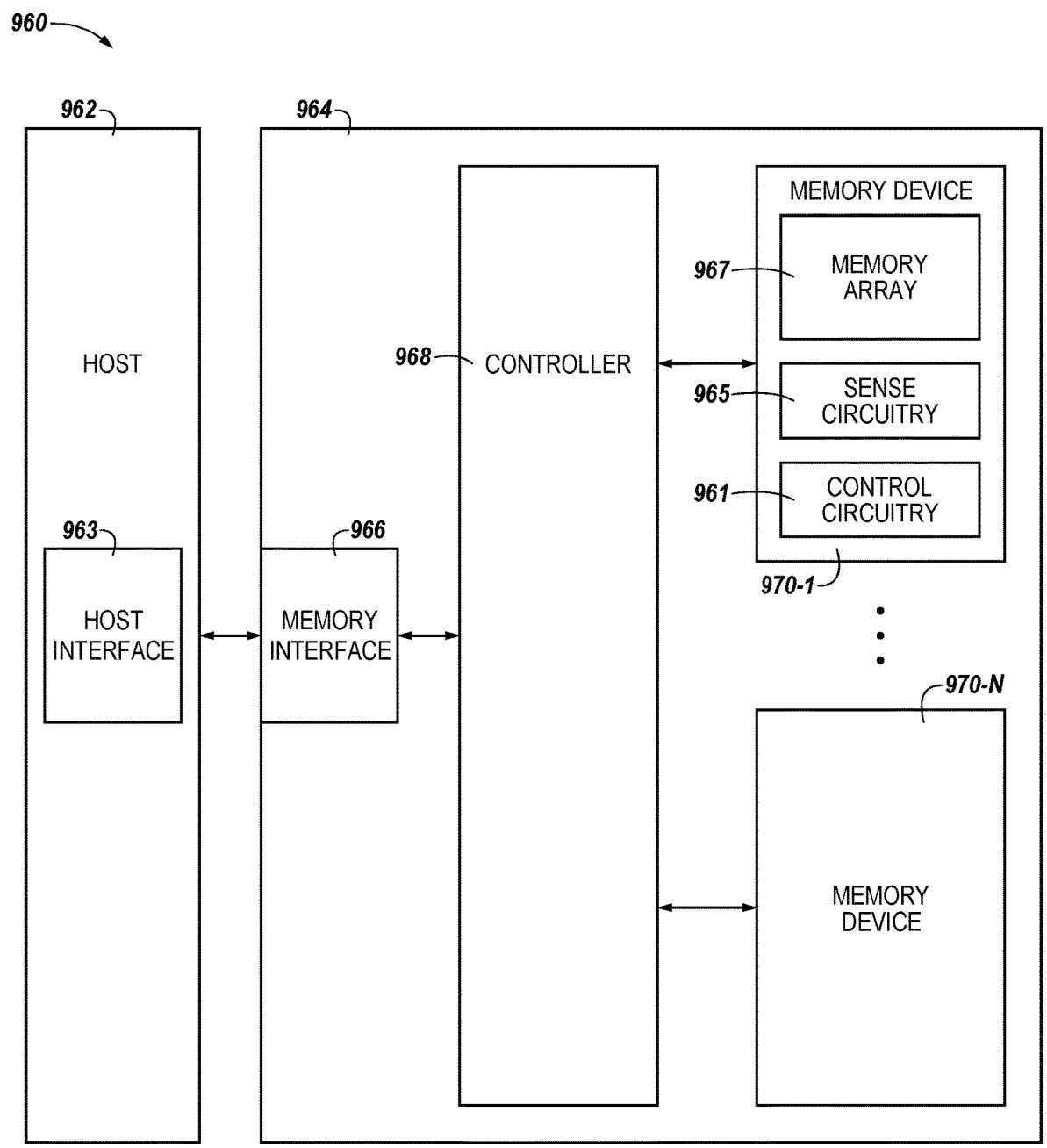
FIG. 9 illustrates a functional block diagram of a computing system including at least one semiconductor structure such as a storage node in a memory array formed in accordance with a number of embodiments of the present disclosure.

FIG. 9 is a functional block diagram of a computing system 960 including at least one memory array having a structure formed in accordance with a number of embodiments of the present disclosure. In the example illustrated in FIG. 9, the system 964 includes a memory interface 966, a number of memory devices 970-1, . . . , 970-N, and a controller 968 selectably coupled to the memory interface 966 and memory devices 970-1, . . . , 970-N. The system 964 may be, for example, a solid-state drive (SSD). The memory interface 966 may be used to communicate information between the system 960 and another device, such as a host 962. The host 962 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. In a number of examples, the host 962 may be associated with (e.g., include or be coupled to) a host interface 963. The host interface 963 may enable exchange of data and commands with a memory interface 966 to a memory device 964.

The memory interface 966 may be in the form of a standardized physical interface. For example, when the system 964 is used for information (e.g., data) storage in computing system 960, the memory interface 966 may be a serial advanced technology attachment (SATA) interface, a peripheral component interconnect express (PCIe) interface, or a universal serial bus (USB) interface, among other physical connectors and/or interfaces. In general, however, the memory interface 966 may provide an interface for passing control, address, information, scaled preferences, and/or other signals between a controller 968 of the system 964 and the host 962 (e.g., via host interface 963).

The controller 968 may include, for example, firmware and/or control circuitry (e.g., hardware). The controller 968 may be operably coupled to and/or included on the same physical device (e.g., a die) as one or more of the memory devices 970-1, . . . , 970-N. For example, the controller 968 may be, or may include, an ASIC as hardware operably coupled to circuitry (e.g., a printed circuit board) including the memory interface 966 and the memory devices 970-1, . . . , 970-N. Alternatively, the controller 968 may be included on a separate physical device that is communicatively coupled to the physical device (e.g., the die) that includes one or more of the memory devices 970-1, . . . , 970-N.

The controller 968 may communicate with the memory devices 970-1, . . . , 970-N to direct operations to sense (e.g., read), program (e.g., write), and/or erase information, among other functions and/or operations for management of memory cells. The controller 968 may have circuitry that may include a number of integrated circuits and/or discrete components which may include a barrier material formed between a dielectric material and a conductor according to embodiments described herein. In a number of examples, the circuitry in controller 968 may include control circuitry for controlling access across the memory devices 970-1, . . . , 970-N and/or circuitry for providing a translation layer between the host 962 and the system 964.

The memory devices 970-1, . . . , 970-N may include, for example, a number of memory arrays 967 (e.g., arrays of volatile and/or non-volatile memory cells). For instance, the memory devices 970-1, . . . , 970-N may include arrays of memory cells that include structures described in connection with FIGS. 1-4B. For example, the memory cells in the memory array 967 of the memory devices 970-1, . . . , 970-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including a barrier material formed between an electrode and a dielectric material as described herein.

The memory devices 970-1, . . . , 970-N may be formed on the same die. A memory device (e.g., the memory device 970-1) may include one or more of arrays of memory cells 967 formed on a die. The memory device 970-1 may include sense circuitry 965 and control circuitry 961 associated with one or more memory arrays 967 formed on the die, or portions thereof. For example, the sense circuitry 965 may be utilized to determine (sense) a particular data value (e.g., 0 or 1) that is stored at a particular memory cell in a row of an array 967. The control circuitry 961 may be utilized to direct the sense circuitry 965 to sense particular data values, in addition to directing storage, erasure, etc., of data values in response to a command from the host 962 and/or the host interface 963. The command may be sent directly to the control circuitry 961 via the memory interface 966 or to the control circuitry 961 via the controller 968.

The example illustrated in FIG. 9 may include additional circuitry that is not illustrated so as not to obscure examples of the present disclosure. For example, the memory devices 970-1, . . . , 970-N may include address circuitry to latch address signals provided over I/O connectors through I/O circuitry. Address signals may be received and decoded by a row decoder and a column decoder to access the memory array 967. It will be appreciated that the number of address input connectors may depend on the density and/or architecture of the memory devices 970-1, . . . , 970-N and/or the memory arrays 967.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, may include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to determining overlay of features of a memory array, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to determining overlay of features of a memory array than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   depositing a barrier material, as a bi-layer material having layers of different oxygen content, on a bottom electrode material of a storage node in a semiconductor fabrication process, wherein depositing the barrier material as the bi-layer material comprises:
      depositing a first layer in contact with the bottom electrode material having a first oxygen content;
      depositing a second layer on the first layer, wherein the second layer has a second oxygen content which is lower than the first oxygen content; and
      depositing the barrier material comprises flowing oxygen into the semiconductor processing chamber using an atomic layer deposition (ALD) process in alternating iterations with flowing titanium or nitrogen precursors for a time range of between 0 to 600 seconds;
   depositing a dielectric material on the barrier material; and
   depositing a top electrode material on the dielectric material.

2. The method of claim 1, wherein depositing the top electrode material comprises forming the top electrode to have a thickness in a range of between 10 angstroms to 40 angstroms.

3. The method of claim 1, further comprising depositing the barrier material using an atomic layer deposition (ALD) process.

4. The method of claim 1, forming the barrier material on a single-sided pillar capacitor.

5. The method of claim 1, forming the barrier material on a double-sided capacitor.

6. A method, comprising:
   forming a first barrier material on a bottom electrode material of a storage node in a semiconductor fabrication process, wherein the first barrier layer has a first oxygen content;
   forming a dielectric material on the first barrier material;
   forming a second barrier material on the dielectric material, wherein the second barrier layer has a second oxygen content, which is lower than the first oxygen content; and
   forming a top electrode material on the second barrier material, wherein forming the first and the second barrier materials comprises forming a $TiO_xN_y$ film as the barrier material to increase a breakdown voltage of the dielectric material, and increase an effective work function in a range of between 0.0 and 0.5 eV.

7. The method of claim 6, wherein forming the first and the second barrier materials decreases a dielectric material leakage.

8. A method, comprising:
   forming a dielectric material on a bottom electrode material of a storage node in a semiconductor fabrication process;
   forming a barrier material, as a bi-layer material having layers of different oxygen content, on the dielectric material to reduce oxygen vacancies, wherein forming the barrier material as the bi-layer material comprises:
      forming a first layer in contact with the dielectric material having a first oxygen content;
      forming a second layer on the first layer, wherein the second layer has a second oxygen content which is lower than the first oxygen content; and
      forming the barrier material as a titanium oxynitride ($TiO_xN_y$) film material on the bottom electrode, wherein the $TiO_xN_y$ film material has an oxygen content in the $TiO_xN_y$ film material in a range of between 3-60 atomic % of the $TiO_xN_y$ film material; and
   forming a top electrode on the barrier material, in contact with the second layer.

9. The method of claim 8, further comprising forming the $TiO_xN_y$ film material on the bottom electrode at a temperature in a range of between 350° to 550° Celsius (C).

10. The method of claim 8, further comprising forming the barrier material to a thickness in a range of between 3 to 20 angstroms (Å).

11. An apparatus, comprising:
    a dielectric material to a semiconductor structure;
    a $TiO_xN_y$ film formed on the dielectric material, wherein the $TiO_xN_y$ film is formed by:
       flowing a titanium tetrachloride ($TiCl_4$) precursor in a deposition chamber over a dielectric material in an atomic layer deposition (ALD) process;
       flowing an ammonia ($NH_3$) precursor in the deposition chamber;
       flowing a purging inert gas;
       repeating iterations of the $TiCl_4$ precursor and the $NH_3$ precursor; and
       flowing an oxygen precursor in the deposition chamber in alternating iterations with the $TiCl_4$ precursor and the $NH_3$ precursor to control oxygen content and a thickness of the $TiO_xN_y$ film, wherein the $TiO_xN_y$ film has a gradient in oxygen content on the dielectric material; and
    an electrode formed on the $TiO_xN_y$ film.

12. The apparatus of claim 11, wherein the $TiO_xN_y$ film has an oxygen content in a range of between 3 to 60 atomic % of the $TiO_xN_y$ film.

13. The apparatus of claim 11, wherein the $TiO_xN_y$ film has a thickness in a range of between 3 to 20 angstroms (Å).

14. The apparatus of claim 11, wherein the apparatus is a single-sided pillar capacitor.

\* \* \* \* \*